United States Patent [19]
Lin et al.

[11] Patent Number: 5,882,947
[45] Date of Patent: Mar. 16, 1999

[54] METHOD FOR PROBING THE ERROR OF ENERGY AND DOSAGE IN THE HIGH-ENERGY ION IMPLANTATION

[75] Inventors: Jen-Tsung Lin, Taichung; Ben Chen; Eddie Chen, both of Hsinchu, all of Taiwan

[73] Assignee: United Microelectronics Corp., Hsinchu, Taiwan

[21] Appl. No.: 906,085

[22] Filed: Aug. 5, 1997

[51] Int. Cl.⁶ ............................. G01R 31/26; H01L 21/66
[52] U.S. Cl. ............................................... 438/14; 324/765
[58] Field of Search ................................ 438/14; 324/765

[56] References Cited

U.S. PATENT DOCUMENTS

| | | | |
|---|---|---|---|
| 4,513,384 | 4/1985 | Rosencwaig | 364/563 |
| 4,522,510 | 6/1985 | Rosencwaig et al. | 374/7 |
| 5,185,273 | 2/1993 | Jasper | 437/8 |
| 5,834,364 | 11/1998 | Brun et al. | 438/527 |

*Primary Examiner*—Brian Dutton
*Attorney, Agent, or Firm*—Pennie & Edmonds LLP

[57] ABSTRACT

A method for probing the error of energy or dosage in the high-energy ion implantation is disclosed herein. The error source that is from either the energy of ion implantation or the dosage of ion implantation non-normal is decided via the thermal signal value and the thickness of the remained oxidation layer after etching step. The error source can be decided by using different decision standards for phosphorous ion implantation or boron ion implantation. The method comprises the steps as follow: a semiconductor silicon wafer is provided as a test wafer, and an oxidation layer is then formed over the test wafer. A high-energy ion implantation, such as phosphorous ion implantation or boron ion implantation is performed. The oxidation layer is etched via an etching process in a fixing etching time. The thickness of the remained oxidation layer after the etching process is probed. A thermal probe is applied to probe the thermal wave signal from the ion-implant-induced damage. Afterward, the thermal wave signal value and the remained oxidation thickness of the high-energy ion implantation are compared with that of a preceding standard group. Then, the different decision standards created from the thermal wave signal value and the remained oxidation thickness for the high-energy phosphorous or boron ion implantation process are submitted. The error source that is from either the energy of ion implantation or the dosage of ion implantation in non-normal state can be decided via the different decision standards.

15 Claims, 3 Drawing Sheets

| P-Implanting Condition | Energy | Dosage |
|---|---|---|
| The first | normal energy − 100 KeV | normal dos 3E13 ions/cm$^2$ |
| The second | normal energy 800 KeV | normal dos * 93 % |
| The third (Standard Group) | normal energy 800 KeV | normal dos 3E13 ions/cm$^2$ |
| The forth | normal energy 800 KeV | normal dos * 107 % |
| The fifth | normal energy + 100 KeV | normal dos 3E13 ions/cm$^2$ |

FIG. 1A

| P-Implanting Condition | TW | The Remained Oxidation Thickness |
|---|---|---|
| The first | 2245.9 | 0 |
| The second | 2279.9 | 244 |
| The third (Standard Group) | 2361.3 | 54 |
| The forth | 2396.3 | 0 |
| The fifth | 2413.2 | 74 |

FIG. 1B

| P-Ion Implantation Result | | Error Source | |
|---|---|---|---|
| TW | The Remained Oxidation Thickness | Energy | Dosage |
| low | low | low | normal |
| low | high | normal | low |
| high | low | normal | high |
| high | high | high | normal |

FIG. 2

| B-Ion Implantation Result | | Error Source | |
|---|---|---|---|
| TW | The Remained Oxidation Thickness | Energy | Dosage |
| high | high | low | normal |
| low | high | normal | low |
| high | low | normal | high |
| low | low | high | normal |

FIG. 4

| B-Implanting Condition | Energy | Dosage |
|---|---|---|
| The first | normal energy − 50KeV | normal dos 3E13 ions/cm$^2$ |
| The second | normal energy 450 KeV | normal dos * 93 % |
| The third (Standard Group) | normal energy 450 KeV | normal dos 3E13 ions/cm$^2$ |
| The forth | normal energy 450 KeV | normal dos * 107 % |
| The fifth | normal energy + 50KeV | normal dos 3E13 ions/cm$^2$ |

FIG. 3A

| B-Implanting Condition | TW | The Remained Oxidation Thickness |
|---|---|---|
| The first | 919.2 | 181 |
| The second | 898.1 | 191 |
| The third (Standard Group) | 907.1 | 161 |
| The forth | 921.6 | 140 |
| The fifth | 893.3 | 145 |

FIG. 3B

METHOD FOR PROBING THE ERROR OF ENERGY AND DOSAGE IN THE HIGH-ENERGY ION IMPLANTATION

BACKGROUND OF THE INVENTION

1. Field of the Invention

The present invention relates to a method of probing ion implantation, and more particularly to a method for probing the error of energy and dosage in the high-energy ion implantation.

2. Description of the Prior Art

A conventional method of probing ion implantation is applied via a thermal probe method. The method can easily measure a thermal wave signal value (TW) from the ion-implant induced damage in a semiconductor substrate. A β silicon wafer is used as a test wafer. Afterward, an ion implantation process is performed, and phosphorous impurities or boron impurities are implanted into the test wafer. As the implanted ions move through a crystal lattice, they displace atoms in their path and thus cause a substantial amount of crystal graphic damage. Then thermal waves are introduced in the test wafer by laser beam heating, and the ion-implantant-induced damage will generate a thermal wave signal value (TW). The method can detect the ion implantation state such as the concentration and the depth of implanted ions via the thermal wave signal value (TW). The thermal probe is easily operated and the probing speed is very rapid. The time of thermal probing is in a range of about 5 minutes to 10 minutes. However, the method is limited to detect the depth of ion diffusion via the thermal probe. The thermal probe can not effectively probe the deep ion state introduced in the test wafer. Therefore, while the high-energy ion implantation is performed, the thermal probe can not probe the entire ion state beneath the surface of the substrate. The thermal probe will only detect the shallow ion state from the ion-implant-induced damage via laser beam heating, which will cause a reduction of thermal wave signal value (TW) and an increase of sigma ($\delta$). The result generates a poor uniformity of ion concentration distribution.

Additionally, While the thermal probe is applied to detect TW, it is difficult to decide the error source of the ion implantation that is from either energy or dosage. When the thermal probe is performed, the non-normal state about TW may be happened. If the error source is not from the extra condition such as the unsteady state of thermal probe, the mistake of the test wafer, or the mistake of the implanted program, etc., it is really difficult to find the problem source only via TW. However, the structure of ion implanter is very complex. Therefore, it usually spends a lot of time to detect the machine before finding the problem source. Accordingly, the conventional method will influence the uptime of the machine and can not effectively probe the error source that is from either the energy or the dosage non-normal in a high-energy ion implantation.

SUMMARY OF THE INVENTION

It is a primary object of the present invention to provide a method of probing the high-energy ion implantation for solving the insufficiency of detecting depth.

It is another object of the present invention to provide a method for probing the error of energy and dosage in the high-energy ion implantation. The method is used by comparing TW and the remained thickness of oxidation layer after an etching process with that of a standard group. After the comparing step, the problem source that is from either energy or dosage non-normal can be easily decided. Therefore, the method can rapidly solve the problem and arise the uptime of the machine.

Accordingly, the present invention provides a method for probing the error of energy and dosage in the high-energy ion implantation. In the prepared step for a test wafer, an oxidation layer is precedently formed on the surface of the test wafer. Then a high-energy phosphorous or boron ion implantation is performed. After the ion implantation step, an etching process is performed to remove a portion of the oxidation layer. The remained oxidation thickness is in a range of about 50 to 500 angstrom. Then a thermal probe is applied to probe a thermal wave signal value (TW) from ion-implanted-reduced damage. The error source that is from either the energy or the dosage non-normal in high-energy ion implantation can be decided via TW and the remained thickness of oxidation layer. When the ion implantation process is performed in different implanting condition such as different energy or different dosage, the oxidation layer will have the different ion concentration. The etching oxidation rate will be also different during the etching process. Additionally, TW is also changed depended on the different ion implantation condition. Therefore, the error source can be decided via TW and the remained oxidation thickness. The ion implantation processes are performed by using five different ion implantation conditions. One of five ion implantation conditions is served as a standard group, and the standard group is performed in a normal energy and a normal dosage of ion implantation. The etching time is modulated to etch the oxidation layer, and the remained oxidation thickness is controlled in a range of about 50 angstrom. Afterward, the oxidation layers in the other four ion implantation conditions are etched via the fixing etching time according the standard group. Every remained oxidation layer will have the different thickness. The error source can be found by comparing TW and the remained oxidation thickness of every one of four ion implantation conditions compared with that of the standard group. Two different kind of the comparing results for phosphorous and boron ion implantation processes are submitted to effectively decide the error source that is from either the energy or the dosage non-normal. The present invention can rapidly find error source and solve the problem, which will arise the uptime of the machine.

BRIEF DESCRIPTION OF THE DRAWINGS

FIG. 1A is a drawing of five kind of phosphorous ion implantation conditions about the different energies and dosages according to the present invention;

FIG. 1B is a drawing of the thermal wave signal values (TW) and the remained oxidation thickness according to five phosphorous ion implantation conditions of FIG. 1A;

FIG. 2 is a drawing showing the error source index for the high-energy phosphorous ion implantation;

FIG. 3A is a drawing of five kind of boron ion implantation conditions about the different energies and dosages according to the present invention;

FIG. 3B is a drawing of the thermal wave signal values (TW) and the remained oxidation thickness according to five boron ion implantation conditions of FIG. 1A; and FIG. 4 is a drawing showing the error source index for the high-energy boron ion implantation.

DESCRIPTION OF THE PREFERRED EMBODIMENT

The conventional probing method merely can get the thermal wave signal value (TW) in proportion to the energy and the dosage of the ion implantation. While TW found in a non-normal state during the process, the original information can be shown as follow:

1. If TW is higher than the normal value, the error source may be decided that the energy or the dosage of the ion implantation is too high.
2. if TW is smaller than the normal value, the error source may be decided to be from the energy or the dosage of the ion implantation being too low.

According to the result shown above, the error source can not be decided to be from either the energy or the dosage of the ion implantation in a non-normal state. Therefore, in the condition of remaining current probing devices, a method for effectively probing the error source form either the energy or the dosage non-normal is provided. The present invention method can effectively probe high-energy ion implantation and decide the error source. In a prepared step for a test wafer, an oxidation layer is formed over the test wafer. The test wafer is made of β silicon wafer. Afterward, a high-energy ion implantation is performed. After the high-energy ion implantation, an etching process according to a preceding fixing etching time is performed to etch a portion of the oxidation layer. The remained thickness of the oxidation layer is in a range of about 50 to 500 angstrom. A thermal probe is applied to probe the thermal wave signal value (TW) from the ion-implantant-induced damage. The etching step can move the ion concentration distribution profile toward the surface of the substrate. Therefore, the problem of detecting depth insufficiency can be solved. Additionally, ions are implanted into the oxidation layer in the different energy conditions or the different dosage conditions. The etching oxidation rates are different in the fixing etching time. Therefore, neglect of un-stability of the probing machines and the factor of man-made careless, the error source can be decided via TW value and the remained oxidation thickness. The error source that is from either the energy or the dosage non-normal can be decided by comparing TW value and the remained oxidation thickness with that of a precedent standard group in the fixing etching time. Accordingly, two embodiments of the present invention are described as follow:

In the first embodiment of the present invention, a high-energy phosphorous ion implantation is performed in an energy range of about 500 KeV to 1.5 MeV. A test wafer which is formed of β silicon is provided. An oxidation layer is then deposited on the substrate of the wafer. The thickness of the oxidation layer is about 4000 to 12000 angstrom. The preferred oxidation thickness is decided based on the condition that the high-energy ion implantation still can be effectively probed after etching the oxidation layer. Afterward, five ion implantation conditions are applied to implant phosphorous ions into the wafer, as shown in FIG. 1A. In the first implanting condition, the energy of ion implantation is lower about 100 KeV than the normal implanting energy and the dosage of the ion implantation is normal dosage of about $3E13$ ions/cm$^2$. In the second implanting conduction, the energy of the ion implantation is normal energy of about 800 KeV and the dosage of the ion implantation is 93 percentage of the normal dosage. In the third implanting conduction, the energy of the ion implantation is normal energy and the dosage of the ion implantation is the normal dosage. In the forth implanting conduction, the energy of the ion implantation is the normal energy and the dosage of the ion implantation is 107 percentage of the normal dosage. In the fifth implanting conduction, the energy of the ion implantation is higher about 100 KeV than the normal implanting energy and the dosage of the ion implantation is the normal dosage. The third implanting condition is served as a standard group. The etching rate is modulated to etch the oxidation layer, and the thickness of the remained oxidation layer is about 50 angstrom. Afterward, according to five ion implantation conditions, the oxidation layer is etched in the fixed etching time. The thermal probe is then applied to probe TW value. At this time, TW values and the remained oxidation thicknesses according to five different implanting conditions can be gotten, as shown in FIG. 1B. According to the experience, the result shown in FIG. 1B is typically produced by three features. The first feature is that TW value is in proportion to the energy of the ion implantation. The second feature is that TW value is increased depended on the increase of the dosage of the ion implantation. The third factor is described as follow: While implanting low energy ions into the test wafer, the ability of ions penetrating the substrate is insufficient. Most of the implanted ions stay in the oxidation layer such that the damage of the oxidation layer will be increased. Therefore, the etching rate of oxidation layer is increased. On the other hand, while the energy of the ion implantation increased, the implanted ions with a small proportion stay in the oxidation layer. The damage of the oxidation layer will be reduced, which will lead to the reduction of the etching rate of the oxidation layer. According to the above-stated three factors and the result of FIG. 1B, a standard of judging the error source is created via TW value and the thickness of the remained oxidation layer for a high-energy ion implantation. Referring to FIG. 2, it shows a drawing of the error source from either the energy or the dosage of ion implantation in a non-normal state via TW value and the remained oxidation layer thickness by comparing the other four ion implantation conditions with the standard group. The decision standard of the error source is described as follow: (1) According to the first and the third factors, while the energy of ion implantation reduced, the TW value will be reduced, too. The ability of ions penetrating the wafer is reduced, such that the proportion of the ion concentration distribution in the oxidation layer will be increased. The damage of the oxidation layer is increased. The etching rate of the oxidation layer is increased, which leads to the thickness of the remained oxidation layer is reduced in the fixing etching time. Therefore, if the TW value is lower than the TW value of the standard group and the thickness of the remained oxidation layer is thinner than that of the standard group, the error source can be decided from the energy of ion implantation reduced. (2) According to the second and the third factors, while the dosage of ion implantation reduced, the TW value will be reduced, too. The proportion of the ion concentration distribution in the oxidation layer will be reduced. The damage of the oxidation layer is reduced. The etching rate of the oxidation layer is reduced, which leads to the thickness of the remained oxidation layer is increased in the fixing etching time. Therefore, if the TW value is lower than the TW value of the standard group and the thickness of the remained oxidation layer is thicker than that of the standard group, the error source can be decided from the dosage of ion implantation reduced. (3) According to the second and the third factors, while the dosage of ion implantation increased, the TW value will be increased, too. The proportion of the ion concentration distribution in the oxidation layer will be increased. The damage of the oxidation layer is increased. The etching rate of the oxidation layer is increased, which leads to the thickness of the remained oxidation layer is reduced in the fixing etching time. Therefore, if the TW value is higher than the TW value of the standard group and the thickness of the remained oxidation layer is thinner than that of the standard group, the error source can be decided from the dosage of ion implantation increased. (4) According to the first and the third factors, while the energy of ion implantation increased, the TW value will be increased, too. The ability of ions penetrating the wafer is increased, such that the proportion of the ion concentration distribution in the oxidation layer will be reduced. The damage of the oxidation layer is reduced. The etching rate of the oxidation layer is reduced, which leads to the thickness of the remained oxidation layer is increased in the fixing etching time. Therefore, if the TW value is higher than the TW value of the standard group and the thickness of the remained oxidation layer is thicker than that of the standard group, the error source can be decided from the energy of ion implantation increased.

In the second embodiment of the present invention, a high-energy boron ion implantation is performed in an energy range of about 250 KeV to 1.2 MeV. A test wafer which is formed of β silicon is provided. An oxidation layer is then deposited on the substrate of the wafer. The thickness of the oxidation layer is about 4000 to 12000 angstrom. The preferred oxidation thickness is decided based on the condition that the high-energy ion implantation still can be effectively probed after etching the oxidation layer. Afterward, five ion implantation conditions is applied to implant boron ions into the wafer, as shown in FIG. 3A. In the first implanting condition, the energy of the ion implantation is lower about 50 KeV than a normal implanting energy and the dosage of the ion implantation is in a normal dosage of about 3E13 ions/cm². In the second implanting conduction, the energy of the ion implantation is in the normal energy of about 450 KeV and the dosage of the ion implantation is 93 percentage of the normal dosage. In the third implanting conduction, the energy of the ion implantation is in the normal energy and the dosage of the ion implantation is in the normal dosage. In the forth implanting conduction, the energy of the ion implantation is in the normal energy and the dosage of ion implantation is 107 percentage of the normal dosage. In the fifth implanting conduction, the energy of the ion implantation is higher about 50 KeV than the normal implanting energy and the dosage of ion implantation is in the normal dosage. The third implanting condition is served as a standard group. The etching rate is modulated to etch the oxidation layer, and the thickness of the remained oxidation layer is about 160 angstrom. Afterward, according to five ion implantation conditions, the oxidation layer is etched in the fixed etching time. The thermal probe is then applied to probe TW value. At this time, TW values and the remained oxidation thicknesses according to five different implanting conditions can be gotten, as shown in FIG. 3B. According to the experiment proving, the result shown in FIG. 3B is typically produced by three factors. The first factor is described as follow: The thickness of the oxidation layer for effectively probing high-energy (B-450 KeV) boron ion implantation is thicker about 1500 angstrom than that for effectively probing high-energy (P-800 KeV) phosphorous ion implantation. The oxidation thickness for high-energy boron ion implantation is decided depended on the sensitivity similar to the sensitivity that high-energy boron ion implantation can be completely probed. However, after the oxidation layer with an original decided thickness is etched, the thermal probe can not still completely probe the entire depth of the high-energy implanted boron ions. Therefore, in the first factor, while the energy of ion implantation reduced, the depth of implanted ions is shallow. The thermal probe can effectively probe such the depth of implanted ions, which will make TW value to increase. On the other hand, while the energy of the ion implantation increased, the depth of implanted ions is deep. The depth for the thermal probe effectively probing is insufficient, which will lead to the reduction of TW value. Therefore, in the first factor, while the energy of ion implantation increased, the depth of implanted ions is deep. The thermal probe can not effectively probe such the depth of implanted ions, which will make TW value to reduce. The second factor is that TW value is increased depended on the increase of the dosage of ion implantation. The third factor is described as follow: Because the decided oxidation thickness for the high-energy boron implantation is thin, almost all implanted ions stay in the substrate. Therefore, the etching oxidation rate is not mainly depended on the dosage of the oxidation layer. The main factor of influencing the etching oxidation rate is depended on the energy of boron ion implantation. While the energy of boron ion implantation increased, the damage of the oxidation layer is large. Therefore, the etching oxidation rate is increased, which will result in the reduction of the thickness of the remained oxidation layer. On the other hand, while the energy of boron ion implantation reduced, the damage of the oxidation layer is small. Therefore, the etching oxidation rate is reduced, which will lead to the increase of the thickness of the remained oxidation layer.

According to the above-stated three factors and the result of FIG. 3B, a standard of judging the error source is created via TW value and the thickness of the remained oxidation layer for a high-energy boron ion implantation. Referring to FIG. 4, it shows a drawing of the error source from either the energy or the dosage of boron ion implantation. The deciding method is used via TW value and the remained oxidation layer thickness by comparing the other four boron ion implantation conditions with the standard group. The decision standard of the error source is described as follow: (1) According to the first and the third factors, while the energy of boron ion implantation reduced, the depth of implanted boron ions is shallow. The depth that the thermal probe can completely probe is increased, which will result in the increase of TW value. Additionally, while the energy of boron ion implantation reduced, the damage of the oxidation layer will be reduced. The etching rate of the oxidation layer is reduced, which leads to the increase of the thickness of the remained oxidation layer in the fixing etching time. Therefore, if the TW value is higher than the TW value of the standard group and the thickness of the remained oxidation layer is thicker than that of the standard group, the error source can be decided from the energy of ion implantation reduced. (2) According to the second and the third factors, while the dosage of ion implantation reduced, the TW value will be reduced, too. The proportion of ion concentration distribution in the oxidation layer will be reduced. The damage of the oxidation layer is reduced. The etching rate of the oxidation layer is reduced, which leads to the increase of the thickness of the remained oxidation layer in the fixing etching time. Therefore, if the TW value is lower than the TW value of the standard group and the thickness of the remained oxidation layer is thicker than that of the standard group, the error source can be decided from the dosage of ion implantation reduced. (3) According to the second and the third factors, while the dosage of ion implantation increased, TW value will be increased, too. The proportion of ion concentration distribution in the oxidation layer will be increased. The damage of the oxidation layer is increased. The etching rate of the oxidation layer is increased, which leads to the reduction of the thickness of the remained oxidation layer in the fixing etching time. Therefore, if the TW value is higher than the TW value of the standard group and the thickness of the remained oxidation layer is thinner than that of the standard group, the error source can be decided from the dosage of ion implantation increased. (4) According to the first and the third factors, while the energy of boron ion implantation increased, the depth of implanted boron ions is deep. The depth that the thermal probe can completely probe is reduced, which will result in the reduction of TW value. Additionally, while the energy of boron ion implantation increased, the damage of the oxidation layer will be increased. The etching rate of the oxidation layer is increased, which leads to the reduction of the thickness of the remained oxidation layer in the fixing etching time. Therefore, if the TW value is lower than the TW value of the standard group and the thickness of the remained oxidation layer is thinner than that of the standard group, the error source can be decided from the increase of the energy of boron ion implantation.

According to the above-stated two embodiments of the present invention, an oxidation layer with an appropriated thickness is formed on a test wafer. The oxidation layer is required to simultaneously satisfy the high-energy ion implantation for boron and phosphorous ions. The appropriated thickness of the oxidation layer is decided depended on the effective probing and sensitivity. The effective probing for the high-energy phosphorous ion implantation must be completed. The sensitivity for the high-energy boron ion implantation can be selected similar to the sensitivity that the boron ion implantation can be completely probed. Afterward, two kind of the decision standards shown in FIG. 2 and FIG. 4 are inducted. In the FIG. 2, it shows a decision standard of the error source for the high-energy phosphorous ion implantation. In the FIG. 4, it shows another decision standard of the error source for the high-energy boron ion implantation. When TW value is in a non-normal state, the error source can be decided from either the energy of the ion implantation or the dosage of the ion implantation via TW value and the remained oxidation thickness. According to the decision standard of the error source indexes shown in FIG. 2 and FIG. 4, the error source can be easily found.

The characteristic of the present invention is that an oxidation layer with an appropriated thickness is formed on a test wafer. In a fixing etching time, the oxidation layer is etched and the remained oxidation thickness is in a range of about between 50 to 500 angstrom. The remained oxidation thickness and TW value are compared with those values of the standard group for the high-energy phosphorous and boron ion implantation. According to the decision standard of the phosphorous or boron ion implantation, the error source can be found to probe the stability of the energy and the dosage of the ion implantation.

Although the decision standard of the error source can rapidly solve some probing problem, two previous conditions must exist. The previous conditions are described as follow:

1. The decision standard can be applied only when a state that either the energy or the dosage is in an error state is happened. If the energy and the dosage are simultaneous in the error state, the problem will become very complex. Therefore, the judging standard must match the other methods to find the problem source.

2. The decision standard can be applied only when the etching rate is in a stable state. The etching rate can be observed and modulated to remain in a stable state by using another new non-implanted test wafer with an oxidation layer on the surface. The non-implanted test wafer and the implanted test wafer are simultaneously etched. The etching rate can be decided whether it is in an un-stability state by using the thickness of the remained oxidation layer of the non-implanted test wafer in a fixing etching time. The method can prevent mistake happen in the time of deciding the error source by simultaneously etching two kind of test wafers. Additionally, the test wafer can be recycled to reduce cost.

Although specific embodiments including the preferred embodiment have been illustrated and described, it will be obvious to those skilled in the art that various modifications may be made without departing from the spirit and scope of the present invention, which is intended to be limited solely by the appended claims.

What is claimed is:

1. A method for probing the error of energy and dosage in an ion implantation, said method comprising the steps of:
   providing a semiconductor silicon wafer as a test wafer;
   forming an oxidation layer over said test wafer;
   performing said ion implantation;
   etching said oxidation layer to remain a portion of said oxidation layer;
   probing the thickness of said remained oxidation layer; and
   probing a thermal wave signal value via a thermal probe.

2. The method of claim 1, wherein said ion implantation is performed with phosphorous ions, said oxidation layer being formed over said test wafer to make said thermal probe to completely probe the entire depth of said ion implantation, and the thickness of said oxidation layer being in a range of about 4000 to 20000 angstroms.

3. The method of claim 2, wherein the energy of said phosphorous ion implantation is in a range of about 500 KeV to 1.5 MeV.

4. The method of claim 3, wherein the thickness of said remained oxidation layer is between about 50 to 500 angstroms.

5. The method of claim 4, wherein said phosphorous ion implantation is performed via five ion implantation conditions, said five ion implantation conditions comprising:
   a first ion implantation condition: the energy of said phosphorous ion implantation being lower about 100 KeV than a normal implanting energy of about 800 KeV, and the dosage of said phosphorous ion implantation being a normal dosage of about 3E13 ions/cm$^2$;
   a second ion implantation condition: the energy of said phosphorous ion implantation being said normal implanting energy, and the dosage of said phosphorous ion implantation being 93 percentage of said normal dosage;
   a third ion implantation condition: the energy of said phosphorous ion implantation being said normal implanting energy, and the dosage of said phosphorous ion implantation being said normal dosage;
   a fourth ion implantation condition: the energy of said phosphorous ion implantation being said normal implanting energy, and the dosage of said phosphorous ion implantation being 107 percentage of said normal dosage; and
   a fifth ion implantation condition: the energy of said phosphorous ion implantation being higher about 100 KeV than said normal implanting energy, and the dosage of said phosphorous ion implantation being said normal dosage.

6. The method of claim 5, wherein said oxidation layer is etched in said third ion implantation condition in a fixing etching time, the thickness of said remained oxidation layer in said third ion implantation condition being about 160 angstroms.

7. The method of claim 6, wherein said oxidation layer is etched in respective said five ion implantation conditions in said fixing etching time, said thermal wave signal value and the thickness of said remained oxidation layer being probed in respective said five ion implantation conditions.

8. The method of claim 7, wherein said thermal wave signal value and the thickness of said remained oxidation layer in said first, said second, said fourth, said fifth ion implantation conditions are respectively compared with said thermal wave signal value and the thickness of said remained oxidation layer in said third ion implantation condition, a decision standard of the error source being inducted comprising:
  (a) when said thermal wave signal value being lower than said thermal wave signal value of said third ion implantation conduction and the thickness of said remained oxidation layer being thinner than the thickness of said remained oxidation layer of said third ion implantation conduction, the error source being decided from the energy of said ion implantation reduced;
  (b) when said thermal wave signal value being lower than said thermal wave signal value of said third ion implantation conduction and the thickness of said remained oxidation layer being thicker than the thickness of said remained oxidation layer of said third ion implantation conduction, the error source being decided from the dosage of said ion implantation reduced;
  (c) when said thermal wave signal value being higher than said thermal wave signal value of said third ion implantation conduction and the thickness of said remained oxidation layer being thinner than the thickness of said remained oxidation layer of said third ion implantation conduction, the error source being decided from the dosage of said ion implantation increased; and
  (d) when said thermal wave signal value being higher than said thermal wave signal value of said third ion implantation conduction and the thickness of said remained oxidation layer being thicker than the thickness of said remained oxidation layer of said third ion implantation conduction, the error source being decided from the energy of said ion implantation increased.

9. The method of claim 1, wherein said ion implantation being performed with boron ions, said oxidation layer is formed over said test wafer to make a sensitivity similar to another sensitivity that said thermal probe completely probe the entire depth of said ion implantation, the thickness of said oxidation layer being in a range of about 4000 to 20000 angstroms.

10. The method of claim 9, wherein the energy of said boron ion implantation is in a range of about 250 KeV to 1.2 MeV.

11. The method of claim 10, wherein the thickness of said remained oxidation layer is between about 50 to 500 angstroms.

12. The method of claim 11, wherein said boron ion implantation is performed via five ion implantation condictions, said five ion implantation condictions comprising:
  a first ion implantation conduction: the energy of said boron ion implantation being lower about 50 KeV than a normal implanting energy of about 450 KeV, and the dosage of said boron ion implantation being a normal dosage of about 3E13 ions/cm$^2$;
  a second ion implantation conduction: the energy of said boron ion implantation being said normal implanting energy, and the dosage of said boron ion implantation being 93 percentage of said normal dosage;
  a third ion implantation conduction: the energy of said boron ion implantation being said normal implanting energy, and the dosage of said boron ion implantation being said normal dosage;
  a fourth ion implantation conduction: the energy of said boron ion implantation being said normal implanting energy, and the dosage of said boron ion implantation being 107 percentage of said normal dosage; and
  a fifth ion implantation conduction: the energy of said boron ion implantation being higher about 50 KeV than said normal implanting energy, and the dosage of said boron ion implantation being said normal dosage.

13. The method of claim 12, wherein said oxidation layer is etched in said third ion implantation conduction in a fixing etching time, the thickness of said remained oxidation layer in said third ion implantation conduction being about 160 angstroms.

14. The method of claim 13, wherein said oxidation layer is etched in respective said five ion implantation condictions in said fixing etching time, said thermal wave signal value and the thickness of said remained oxidation layer being probed in respective said five ion implantation condictions.

15. The method of claim 14, wherein said thermal wave signal value and the thickness of said remained oxidation layer in one of said first, said second, said fourth and said fifth ion implantation condiction are respectively compared with said thermal wave signal value and the thickness of said remained oxidation layer in said third ion implantation condiction, a decision standard of the error source being inducted comprising:
  (a) when said thermal wave signal value being higher than said thermal wave signal value of said thrid ion implantation conduction and the thickness of said remained oxidation layer being thicker than the thickness of said remained oxidation layer of said thrid ion implantation conduction, the error source being decided from the energy of said ion implantation reduced;
  (b) when said thermal wave signal value being lower than said thermal wave signal value of said thrid ion implantation conduction and the thickness of said remained oxidation layer being thicker than the thickness of said remained oxidation layer of said thrid ion implantation conduction, the error source being decided from the dosage of said ion implantation reduced;
  (c) when said thermal wave signal value being higher than said thermal wave signal value of said thrid ion implantation conduction and the thickness of said remained oxidation layer being thinner than the thickness of said remained oxidation layer of said thrid ion implantation conduction, the error source being decided from the dosage of said ion implantation increased; and
  (d) when said thermal wave signal value being lower than said thermal wave signal value of said thrid ion implantation conduction and the thickness of said remained oxidation layer being thinner than the thickness of said remained oxidation layer of said thrid ion implantation conduction, the error source being decided from the energy of said ion implantation increased.

* * * * *